United States Patent
Arcidiacono et al.

(10) Patent No.: US 9,407,353 B2
(45) Date of Patent: Aug. 2, 2016

(54) PROCESS FOR GENERATING A MAPPING OF THE TRANSMISSION OR RECEPTION COVERAGE OF AN ANTENNA OF A GROUND STATION FOR SATELLITE LINKS

(71) Applicant: EUTELSAT S A, Paris (FR)

(72) Inventors: Antonio Arcidiacono, Paris (FR);
Daniele Vito Finocchiaro, Paris (FR);
Alessandro Le Pera,
Issy-les-Moulineaux (FR); Fritz Schurig, Triel-sur-Seine (FR)

(73) Assignee: EUTELSAT S A, Paris (FR)

( * ) Notice: Subject to any disclaimer, the term of this patent is extended or adjusted under 35 U.S.C. 154(b) by 0 days.

(21) Appl. No.: 14/951,765

(22) Filed: Nov. 25, 2015

(65) Prior Publication Data

US 2016/0156408 A1 Jun. 2, 2016

(30) Foreign Application Priority Data

Nov. 27, 2014 (FR) .................................... 14 61588

(51) Int. Cl.
*H04B 7/185* (2006.01)
*H04B 17/10* (2015.01)

(52) U.S. Cl.
CPC .......... *H04B 7/18519* (2013.01); *H04B 17/102* (2015.01)

(58) Field of Classification Search
CPC .. H04B 1/69; H04B 7/18523; H04N 21/6112; H04N 21/6143; H04N 21/6162; H04N 21/6193; H04N 21/643; H04N 7/20
See application file for complete search history.

(56) References Cited

U.S. PATENT DOCUMENTS

| | | | | |
|---|---|---|---|---|
| 5,734,345 A * | 3/1998 | Chen | ..................... | H01Q 3/2694 342/367 |
| 7,313,143 B1 * | 12/2007 | Bruno | ................... | H04W 28/16 342/36 |
| 8,116,787 B1 * | 2/2012 | Lektuai | ................... | H04W 4/02 370/331 |
| 2003/0017827 A1 * | 1/2003 | Ciaburro | ................ | H04B 17/20 455/427 |
| 2015/0256134 A1 * | 9/2015 | Arcidiacono | ............. | H03F 1/32 330/2 |

FOREIGN PATENT DOCUMENTS

| | | |
|---|---|---|
| DE | 34 22 851 A1 | 1/1986 |
| EP | 2 629 439 A1 | 8/2013 |
| FR | 2 739 191 A1 | 3/1997 |

OTHER PUBLICATIONS

Search Report as issued in French Patent Application No. 1461588, dated Jun. 22, 2015.
Pedersen, M.N., et al., "Three-dimensional radiation pattern measurement strategy for ground station antennas," International Journal of Satellite Communications and Networking, vol. 31, No. 1, 2013, pp. 39-50.

* cited by examiner

*Primary Examiner* — Sujatha Sharma
(74) *Attorney, Agent, or Firm* — Pillsbury Winthrop Shaw Pittman LLP

(57) ABSTRACT

A process for measuring antenna gains of a transmitter for generating at least one radiation pattern of the antenna, the process including a plurality of transmissions of a test signal sent to a satellite to retransmit the test signal to a second terrestrial station, the transmissions being carried out according to different orientations, the test signal being spread spectrum modulated by a pseudo-random numerical sequence; a reception of each test signal; a demodulation of each test signal making it possible to measure the power of each test signal received; a comparison of each power with a first threshold; a generation of an encoding instruction aiming to encode a given number of sequences of data bits by at least one pseudo-random sequence.

19 Claims, 3 Drawing Sheets

PROCESS FOR GENERATING A MAPPING OF THE TRANSMISSION OR RECEPTION COVERAGE OF AN ANTENNA OF A GROUND STATION FOR SATELLITE LINKS

CROSS-REFERENCE TO RELATED APPLICATIONS

This application claims priority to French Patent Application No. 1461588, filed Nov. 27, 2014, the entire content of which is incorporated herein by reference in its entirety.

FIELD

The field of the invention relates to methods for measuring powers and transmission patterns of an antenna to establish a mapping of the coverage of said antenna. In particular, the field of the invention relates to tests of transmission and reception of an antenna of a transmitter of a station on the ground to establish a mapping representing a coverage zone for the transmission of data.

BACKGROUND

"Radiation pattern" of an antenna is taken to mean the different powers of a test signal $S_{test}$ received in a receiver by varying the orientation of the antenna of the transmitter. When all the measurements are completed, it is possible to establish a mapping of the coverage of the antenna which is tested. Coverage mapping is very useful in so far as when the positions of the transmitter and the receiver and the orientations of the antennas are known, it is possible to adjust the transmission power required in order to establish a radiofrequency link between the different elements of a radiocommunication system.

At present, solutions exist to carry out antenna tests aiming to establish a radiation pattern of the latter particularly for ground-satellite links and vice versa for satellite-ground links.

An important test consists in validating the terrestrial coverage zone of the transmissions and receptions of antennas of satellites and validating the coverage of antennas on the ground in transmission and in reception to satellites.

A problem of antenna tests, such as tests making it possible to verify radiation patterns and transmission levels, is posed as soon as the measurements involve a radiocommunication link by satellite. In fact, these tests are known to generate perturbations and interferences in an environment neighbouring the equipment tested or the satellite.

In fact, these tests are ideally carried out while the satellite is operational, that is to say that no interruption of service has to be scheduled or undergone.

Moreover, the carrying out of this type of test is generally controlled by regulations that impose limited power levels, as a result antenna coverage tests are difficult to implement because they generally require a configuration in which the transmission powers are high.

Another problem arises from interferences caused on the system tested. In fact, antennas are capable of receiving other radiofrequency waves perturbing measurements during tests. This is particularly the case when measurements are taken at the limit range of the antennas or when the levels of the test signals become weak or are drowned in the noise level.

Finally, these tests in transmission often themselves cause interferences on other third party systems, which it is sought to avoid.

Numerous methods exist at present. On the other hand, certain methods include tests which define high power levels to transmit in the direction of the satellite, other tests require the transmission of high powers by the satellite. The test signals received by a terrestrial station make it possible in particular to qualify the quality of the signals transmitted and/or received by the satellite, the directivity of the antenna, the coverage of the antenna, the acceptable levels, saturations, etc.

Tests making it possible to establish a mapping of the coverage of an antenna may be carried out in different ways.

A solution exists that makes it possible to establish a mapping of the coverage of an antenna of a satellite described in the document of patent EP 2 629 439. On the other hand, this solution which makes it possible to rely on a spread spectrum signal is suited to the establishment of a pattern of a satellite antenna and not a ground antenna.

At present, there are two ways of carrying out tests making it possible to establish the radiation pattern of an antenna on the ground in a configuration in which the transmission takes place from a first station on the ground to a satellite which relays the transmission to a second station on the ground.

A first solution consists in varying the orientation of the transmitting antenna on the ground. In this case, the antenna gains of the station on the ground in transmission and that of the satellite are fixed. The power received and measured at the level of the ground station in reception gives the radiation pattern of the antenna in transmission from the ground station.

A second solution consists in varying the orientation of the receiving antenna on the ground. In this case, the orientation of the transmitting antenna on the ground is fixed and its gain is fixed. The satellite may introduce a fixed or variable gain according to the configuration. Power measurements in reception make it possible to deduce a radiation pattern of the antenna in reception.

However, no method makes it possible to test the radiation pattern of an antenna on the ground linked with a satellite without causing certain perturbations to other radiocommunication systems nearby said satellite.

The technical problem not resolved by the prior art relates to the reduction of interferences caused on space systems surrounding a satellite that it is wished to call upon in a transmission chain in order to carry out coverage tests of an antenna situated on the ground and communicating with the satellite system.

SUMMARY

An aspect of the invention makes it possible to resolve the aforementioned drawbacks.

An aspect of the invention relates to a process for measuring antenna gains of a transmitter of a first terrestrial station for the generation of at least one mapping of the coverage of the antenna. Moreover, the process includes:

A plurality of transmissions of a test signal by a transmitter of a first terrestrial station sent to a satellite including a repeater to retransmit the test signal to a second terrestrial station, the transmissions of the transmitter of the first station being carried out according to different orientations of the antenna of the transmitter, the test signal being spread spectrum modulated in a channel of predetermined width by a pseudo-random numerical sequence encoding at least one sequence of data bits generated by a computer of the transmitter;

A reception of each test signal by a receiver of the second terrestrial station;

A demodulation of each test signal making it possible to measure the received power of each test signal;

A comparison of each power with a first predefined reference power threshold;

A generation of an encoding instruction aiming to encode a given number of sequences of data bits by at least one pseudo-random sequence in a same test signal when the received power of a test signal is below the first power threshold.

A benefit is to make it possible to carry out an antenna power test in transmission for each orientation of the antenna by automatically adapting the transmission conditions as a function of the characteristics of a reception.

A benefit of encoding the sequence of data bits or the number of sequences used is to improve the reception conditions of the signal by increasing the processing gain in reception.

According to an embodiment, the test signal generated includes a plurality of PN sequences, the number of PN sequences being dependent on the transmission power level of the test signal and the orientation of the antenna.

According to an embodiment, the sequence of data bits is a sequence only including bits of value equal to 1 such that the sequence received corresponds to the PN sequence.

According to an embodiment, at least one sequence of data bits includes data encoding the current orientation of the transmitting antenna of the transmitter of the first terrestrial station, the process including a decoding of the sequence of data bits by a computer of the receiver of the second terrestrial station to assign the decoded current angular orientation of the antenna of the transmitter to the power of the test signal measured in reception.

According to an embodiment, at least one sequence of data bits includes, moreover, data corresponding to the transmission power of the antenna of the transmitter of the first terrestrial station.

According to an embodiment, at least one sequence of data bits includes, moreover, data corresponding to the scanning speed of the antenna of the transmitter of the first terrestrial station.

According to an embodiment, at least one sequence of data bits includes, moreover, data corresponding to a calibration of the test signal transmitted by the antenna of the transmitter of the first terrestrial station.

According to an embodiment, the process includes a generation of a motor enslavement instruction making it possible to control the scanning speed of the antenna of the transmitter of the first terrestrial station as a function of the measured power level of the test signal received.

According to an embodiment, the process includes a generation of a motor enslavement instruction making it possible to control the scanning speed of the antenna of the transmitter of the first terrestrial station as a function of the orientation of the antenna corresponding to the measurement of the measured power of the test signal received.

According to an embodiment, the test signal includes a co-polarised wave component, corresponding to the transmission polarisation of the signal and a cross-polarised wave component, corresponding to the polarisation orthogonal to the transmission polarisation, the repeater of the satellite amplifying the two polarisations, the receiver of the second station on the ground demodulating the two orthogonal components of the test signal, the measurement of the power of the test signal including a measurement of the power of the transmission polarisation component, the process further including a step of comparing the power of the transmission polarisation component with a second reference power threshold so as to generate automatically an encoding instruction when the power value is less than the second power reference threshold.

According to an embodiment, the measurement of the power of the test signal includes a measurement of the power of the cross-polarised wave component of the test signal received by the receiver of the second terrestrial station and in that a comparison of the received power level of the cross-polarised component with a third reference power threshold makes it possible to generate a synchronisation instruction, the synchronisation instruction making it possible to retrieve a frequency reference data and/or a time reference data calculated from the demodulation of the transmission polarisation component.

According to an embodiment, the generation of a synchronisation instruction leads to the generation of an encoding instruction.

According to an embodiment, at least one encoding instruction and/or at least one motor enslavement instruction is automatically transmitted to a computer of the transmitter of the first terrestrial station by means of a return channel.

According to an embodiment, the return channel is established:
Either through a terrestrial network;
Or through a wireless channel passing through the satellite and transmitted to a receiver of the first terrestrial station.

According to an embodiment, the scanning speed of the antenna of the transmitter of the first terrestrial station is coordinated with the number of sequences of data bits encoded by at least one pseudo-random sequence such that the scanning of the antenna includes sufficiently long durations of maintaining the antenna at a given orientation so that a test signal including a plurality of sequences of data bits can be transmitted.

According to an embodiment, the number of sequences of data bits is determined to obtain a desired processing gain in reception of the antenna of the receiver of the second terrestrial station.

According to an embodiment, a measurement of the interferences amplified by the repeater of the satellite is carried out in reception by the receiving antenna in order to deduce an interference compensation factor for each power measurement received.

Another aspect of the invention relates to a method for generating a series of measurements to establish the mapping of a transmission pattern of an antenna of a transmitter of a terrestrial station, characterised in that a series of measurements of powers of test signals received by a receiver of a second terrestrial station carried out by the process of the invention, the power measurements each being associated with an orientation of the antenna of the transmitter of the first terrestrial station and being memorised in a memory of the second terrestrial station.

Another aspect of the invention relates to a system including:
a first station on the ground comprising a generator of signals making it possible to encode a first sequence of data bits on a test signal to transmit from a first antenna;
a satellite comprising at least one receiving antenna to receive the test signal, at least one transponder to retransmit the amplified test signal to a second terrestrial station;
a second terrestrial station comprising at least one receiving antenna and a physical computer configured to calculate and process the signal to demodulate the test signal received by the satellite and automatically generate an encoding instruction according to the process of the invention.

According to an embodiment, the sequence of data bits is a bit stream transmitted at a rate between 500 bps and 10 kbps.

According to an embodiment, the transmission channels between the transmitter of the first terrestrial station to the satellite and the reception channels between the satellite and the receiver of the second terrestrial station have a bandwidth comprised between 20 and 120 MHz and the central frequency of the channels is comprised between 1 GHz and 40 GHz.

According to an embodiment, the first spread spectrum modulation includes an encoding rate comprised between 4 and 80 Msymbols/s. Msymbols/s signifying "millions of symbols per second". The encoding rate is defined for a number of symbols per second. In scientific terminology the denomination Mchip/s is also employed.

According to an embodiment, the spread spectrum modulation is achieved by the use of a pseudo-noise sequence.

BRIEF DESCRIPTION OF THE DRAWINGS

Other characteristics and benefits of the invention will become clear from reading the detailed description that follows, with reference to the appended figures, which illustrate.

DETAILED DESCRIPTION

Figure 1:
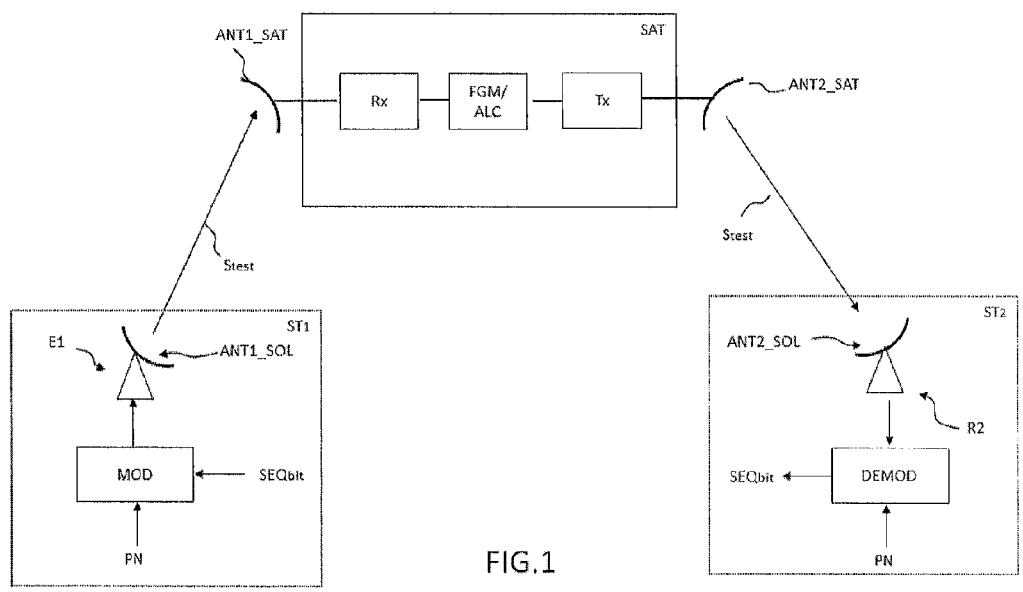
FIG. 1: a diagram representing the different elements of the system of an embodiment of the invention to implement the process of an embodiment of the invention.

FIG. 1 represents an example of embodiment of the process and the system of the invention.

The process of an embodiment of the invention makes it possible to establish a communication by radio route from a first station on the ground ST1 to a second station on the ground ST2, the communication passing through at least one repeater of a geostationary satellite SAT.

The aim of an embodiment of the invention is to establish a mapping of the coverage of an antenna in transmission ANT1_SOL on the ground. This mapping is carried out by testing for different orientations of the transmitting antenna ANT1_SOL, certain characteristics in reception of a test signal $S_{test}$ following the communication link. In particular, a measurement of the received power of each test signal $S_{test}$ is carried out by the receiving antenna ANT2_SOL of the second station on the ground ST2.

The series of measurements taken makes it possible to establish a mapping of the coverage of the transmitting antenna ANT1_SOL.

FIG. 1 represents a first ground station ST1 including a transmitter E1 having a transmitting antenna to test, noted ANT1_SOL.

The ground station ST1 includes a modulator MOD which makes it possible to modulate a sequence of data bits $SEQ_{BIT}$ by a pseudo-random PN sequence. A physical computer makes it possible to configure the processing gain and to encode the data of the $SEQ_{BIT}$ sequence. This computer is not represented in FIG. 1. The physical computer include a processor and a memory encoded with computer readable instructions to carry out or cause to carry out various functions of the computer (e.g. configure the processing gain and encode the data). A motor makes it possible to enslave the orientation of the antenna ANT1_SOL in order to cover a cone of transmission to test. The plots of powers received in the second station on the ground ST2 make it possible to deduce a mapping of the coverage of the transmitting antenna ANT1_SOL at the end of the test.

The station on the ground ST1 potentially includes a network component to be connected to an internet or telephone type network. This network may be used to communicate data between the two ground stations ST1 and ST2. This latter network component is not represented in FIG. 1.

FIG. 1 represents a test signal $S_{test}$ transmitted by the first ground station ST1 and received by the satellite SAT. The satellite SAT includes a receiving antenna ANT1_SAT of a receiver Rx. The receiver is connected to a repeater, the objective of which is particularly to amplify a signal and to retransmit it to a second terrestrial station ST2.

To this end, the satellite includes a transmitter Tx including a transmitting antenna ANT2_SAT. The test signal $S_{test}$ is redirected to the second ground station ST2.

The satellite may be configured in a first FGM mode introducing a fixed amplification gain of the tested signal $S_{test}$. In a second mode, the satellite SAT is configured in ALC mode making it possible to assure a fixed gain at the output of the antenna of the satellite ANT2_SAT whatever the input level of the test signal $S_{test}$ at the input of the satellite. In this latter mode, the gain of the repeater is adapted and thus variable to assure a fixed power at the output of the transmitter of the satellite SAT.

The second ground station ST2 includes a receiver R2 comprising at least one receiving antenna ANT2_SOL. Potentially, a second antenna ANT2_SOL(2) is used to capture the crossed polarisation component. A second antenna in reception may also be used to measure the level of interferences received. A demodulator DEMOD makes it possible to demodulate the test signal $S_{test}$ to deduce the sequence of data bits $SEQ_{BIT}$. The demodulator DEMOD uses the PN sequence used by the modulator of the transmitter to demodulate the test signal $S_{test}$ in base band. The PN sequence of the transmitter of ST1 and the receiver of ST2 is thus known.

Figure 2:
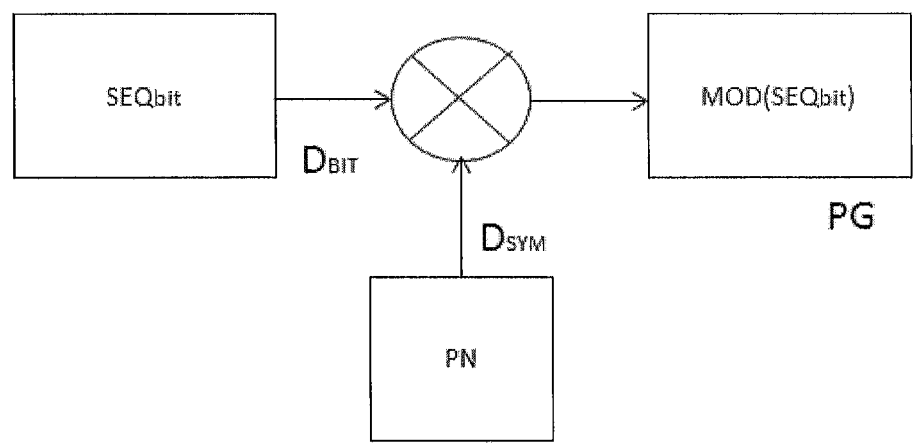
FIG. 2: a modulation of a sequence of data bits by a pseudo-random sequence according to the process of an embodiment of the invention.

FIG. 2 represents a diagram representing blocks of the modulator MOD. The sequence $SEQ_{BIT}$ configured with a rate $D_{BIT}$ is modulated by the PN sequence configured with a rate $D_{sym}$. The modulator MOD makes it possible to generate a spread spectrum sequence in an upward channel while assuring a predetermined processing gain. This processing gain may be configured by a physical computer and controlled manually or automatically, for example remotely.

Ground Station Emission, Modulation

As set forth within the context of FIG. 1, a sequence of data bits $SEQ_{bit}$ is modulated by a pseudo noise PN sequence so as to frequency spread the spectrum in the width of the transmission channel.

The PN sequence used may be a DSSS sequence signifying "Direct Sequence Spread Spectrum" (known as "étalement de spectre à séquence directe" in French).

A test signal $S_{test}$ is transmitted by means of a carrier frequency. The spread spectrum modulation makes it possible to spread the power of the signal in a frequency band around the carrier frequency and to reduce the power density transmitted by the transmitting antenna ANT1_SOL. The transmitted power density may potentially be drowned in radio noise according to the configuration of the PN sequence used.

A benefit of the use of a pseudo noise PN sequence is to limit interferences caused to other radiofrequency systems by the transmission of high power signals.

Transmission Power

The power of the test signal $S_{test}$ transmitted by the transmitting antenna ANT1_SOL is configured such that the power is constant for a given orientation.

According to a first embodiment, the transmitted power of each test signal $S_{test}$ is identical for each orientation of antenna ANT1_SOL so as to benefit from a common reference.

According to a second embodiment, the transmitted power of each test signal $S_{test}$ for each orientation of the antenna ANT1_SOL is configured to assure a detection of the signal by the satellite and by the receiving antenna ANT2_SOL of the second ground station ST2.

In this instance, several embodiment variants are possible.

According to an embodiment variant, the receiver of the second ground station ST2 does not á priori know the transmission power of each test signal $S_{test}$ transmitted. The power measurement of the test signal received $S_{test}$ is saved in a memory of the receiver of the second ground station ST2. Each measurement is thus saved for each orientation of the antenna ANT1_SOL.

The measurements in reception are then compared to a series of configuration data saved in a memory of the transmitter of the first ground station ST1. To carry out this comparison, the measurements in reception at the level of the second ground station ST2 and the configuration data of each transmission of the first ground station ST1 are compared for example by using time and date stamping data or data making it possible to associate each test signal $S_{test}$ transmitted with each test signal $S_{test}$ received.

Reconciliation may be achieved by a transmission of the saved reception measurements from the second ground station ST2 to the first ground station ST1. Reciprocally, the configuration data of the transmitter of the first ground station ST1 may be transmitted to a computer and a memory of the second ground station ST2 to carry out comparisons.

According to embodiment variants, the transmissions may use a terrestrial network such as an internet network or instead a wireless link. In this latter case, the data or measurements of the first ground station ST1 may be transmitted via an uplink to the satellite and retransmitted via a downlink to the second ground station ST2 or vice versa.

According to an embodiment variant, when a satellite link is used, another transmission channel may be used, in this case the data link takes another route of the satellite, that is to say another repeater.

Another particularly beneficial variant of the invention makes it possible to encode the power data of each transmission of the transmitting antenna ANT1_SOL in the sequence of data bits $SEQ_{BIT}$. In this case, in reception, the level of the test signal received $S_{test}$ is measured and recorded. The test signal $S_{test}$ is demodulated and the sequence of data bits $SEQ_{BIT}$ is decoded so as to extract configuration data of the test such as the power transmitted in transmission for each orientation. Other data may be encoded such as for example the orientation of the transmitting antenna, which is described hereafter in the description.

When the power in transmission is adapted to each transmission, a compensation parameter is introduced to correct the measurements in order to establish a homogeneous mapping of the coverage of the transmitting antenna ANT1_SOL. In fact, when the transmitting antenna ANT1_SOL is at the limit of range vis-à-vis the satellite, a maximum power should be configured in transmission so that the test signal $S_{test}$ can be routed to the second ground station ST2. When the antenna points directly at the satellite, a lower power of the test signal $S_{test}$ is needed. The compensation parameter makes it possible to take into account the differences in power in transmission to establish a plot of values which are comparable in order to establish a coverage mapping representative of the performances of the antenna.

The power values received in reception may be:
- either corrected immediately at the level of the receiver by integrating each compensation parameter deduced from each power in transmission when the latter is communicated in the sequence of data bits $SEQ_{BIT}$;
- or not corrected immediately, when the power measurements in reception are communicated to the first base station after all of the tests of each orientation to carry out the antenna coverage calculations later.

Orientation of the Antenna

The process includes the determination of one of the antenna ANT1_SOL of the station ST1. For each orientation, at least one sequence of data bits $SEQ_{BIT}$ is modulated by a pseudo-noise PN sequence so as to spread the power over a given frequency band.

For each test signal $S_{test}$ transmitted, an orientation of the transmitting antenna ANT1_SOL is determined. According to the process of an embodiment of the invention, the guiding of the orientation of the antenna ANT1_SOL covers a series of orientations defining a cone of angles to test. The resolution or the angular "pitch" may be defined by a particular configuration of the motor controlling the antenna. For example, at each change of orientation, a difference of 1° may be defined between two successive orientations of the transmitting antenna.

The process of an embodiment of the invention makes it possible to define and to configure the scanning of the transmitting antenna to cover the cone to test. Each power measurement received in the second ground station ST2 makes it possible to establish a mapping of the coverage of the transmitting antenna ANT1_SOL.

According to an embodiment, a sequencing of the scanning of the antenna ANT1_SOL is predefined. The scanning speed may be preconfigured and/or controllable by a manual or automatic command. According to an embodiment, the second station on the ground ST2 including the receiving antenna ANT2_SOL includes a computer making it possible to transmit an instruction for guiding the orientation of the transmitting antenna ANT1_SOL and its scanning speed. This instruction may be transmitted by a terrestrial network such as the internet or telephone network or instead by a wireless network for example using a transmission channel by satellite route.

Encoding Rate-Processing Gain

The process of an embodiment of the invention makes it possible to determine the length of the sequence of data bits $SEQ_{BIT}$ and the number of repetitions of this sequence in the signal $S_{test}$ modulated by the PN sequence. The $SEQ_{BIT}$ sequence is characterised by a transmission rate $D_{SEQ}$ of a number of data bits $N_{BIT}$ transmitted per second.

The process of an embodiment of the invention also makes it possible to determine the length of the PN sequence, that is to say the number of symbols present in the PN sequence. The PN sequence includes a sequence of symbols and is characterised by a transmission rate $D_{PN}$. The PN sequence thus includes a rate $D_{PN}$ of a number of symbols $N_{SYM}$ transmitted per second.

The modulation of the $SEQ_{BIT}$ sequence by the PN sequence correspond to an encoding of each data bit by a plurality of symbols of the PN sequence. An encoding rate is thus defined which corresponds to the ratio: $T_{COD}=D_{SYM}/D_{BIT}$.

The encoding rate determines a processing gain noted $G_T$ and expressed in decibels dB. The processing gain $G_T$ is a gain which makes it possible to improve the signal to noise ratio during the operation of demodulation at the level of the receiver of the second ground station ST2.

Thus the transmission of a $SEQ_{BIT}$ sequence spread spectrum modulated by a PN sequence in a frequency band defining a channel around a carrier of a signal $S_{test}$ makes it possible to reduce the power density transmitted by the transmitting antenna ANT1_SOL while conserving the possibility of demodulating the signal in reception with a processing gain benefiting the detection of the signal.

According to an embodiment, the PN sequence may be repeated in the test signal $St_{est}$ a certain number of times with or without encoding of a sequence of data bits $SEQ_{BIT}$ so as to increase the detection capacities of the test signal in reception.

According to an embodiment, a plurality of PN sequences are transmitted in the test signal $S_{test}$ and at least one of them is configured to encode the sequence of data bits $SEQ_{BIT}$. This configuration makes it possible on the one hand to increase the gain in reception and to facilitate the detection of the signal and, on the other hand, the encoding of at least one sequence of data bits makes it possible to transmit configuration data to the receiver, such as the power transmitted, the orientation of the antenna or the scanning speed of the antenna.

Synchronisation

According to an embodiment, the process of an embodiment of the invention includes the use of at least one PN sequence which makes it possible to establish a synchronisation data. That is to say that the detection of a test signal $S_{test}$ may constitute a time marking such as a time and date stamping. The detection of the test signal may be carried out by the detection of a power peak after demodulation of the signal thanks to knowledge of the PN sequence in reception and an autocorrelation of this sequence.

The synchronisation data makes it possible in particular to define time references between the transmitter and the receiver. Furthermore, it makes it possible to index the measurements saved and to associate each measurement with a given instant and thus to associate therewith an orientation of the transmitting antenna AN1_SOL. Moreover, when different polarisations of the test signal $S_{test}$ are detected in reception by the receiving antenna ANT2_SOL, the synchronisation data may make it possible to associate together different detected measurements according to different polarisations of the test signal $S_{test}$ to improve the power measurements.

Cross-Polarisation and Copolarisation

The process of an embodiment of the invention takes advantage of the use of a test signal $S_{test}$ including different polarised components.

According to an embodiment, the test signal $S_{test}$ transmitted by the transmitting antenna ANT1_SOL is mainly polarised according to a given polarisation, called copolarisation. A polarisation component crossed with the copolarised component is generated intrinsically at the transmission of the test signal $S_{test}$.

The power of the crossed polarisation component is attenuated vis-à-vis the copolarised component. In fact, the useful power density of the test signal $S_{test}$ is mainly contained in the copolarised component.

At the level of the satellite, the process of an embodiment of the invention makes it possible to configure two routes of the repeater each making it possible to amplify a component of the signal. In this embodiment, the crossed polarisation components of the signals retransmitted to the second ground station ST2 which would be induced by the satellite itself in each route are ignored.

The amplifiers of the satellite may be configured preferentially with a maximum fixed gain, for example in FGM, the acronym of which signifies "Fixed Gain Mode". When the satellite is configured on a maximum gain, the dynamic detection range of the receiver of the second station on the ground is maximum.

On the ground, in this embodiment, the receiver may include two receiving antennas ANT2_SOL(1) and ANT2_SOL(2) to detect each polarised component: the copolarised component and the crossed polarisation component. The two antennas ANT2_SOL(1) and ANT2_SOL(2) are thus configured with orthogonal polarisations. The copolarised component is the component including the greatest power density and it is naturally detected and demodulated by the receiver of the second ground station ST2.

As a function of the orientation of the antenna ANT1_SOL and the transmission power of the test signal $S_{test}$, the level of the test signal $S_{test}$ received in reception at the second ground station ST2 can vary according to a wide range of values. The ratio of useful signal power to noise power level may vary and detections of the useful signals may become difficult to implement. Different cases of detection may then take place according to the polarisation components considered.

A first gain factor may be calculated by a computer of the receiver. The first gain factor is calculated as a function of the received power of the copolarised component.

When the power of the test signal $S_{test}$ is very low according to the crossed polarisation component and when the receiver does not detect any crossed component whereas a copolarised component is detected, the process of an embodiment of the invention makes it possible to recover information items stemming from the reception of the copolarised component to improve the detection of the crossed polarisation component. Among these information items, at least one frequency and/or time reference of the detected signals of the copolarised component may be used so as to optimise the frequency and/or time detection thresholds of the crossed polarisation component.

In the case of a receiving antenna ANT2_SOL(2) dedicated to the detection of the crossed polarisation component, the latter may be controlled by a frequency and time reference deduced from the detection of the receiving antenna of the copolarisation ANT2_SOL(1) of the test signal $S_{test}$ by demodulating the sequence of data bits received.

A second gain factor may be calculated to adapt automatically the gain of the transmitter of the first base station ST1. For example, by controlling a higher power level to obtain the crossed polarisation component. In this latter case, a terrestrial or wireless link, for example satellite, may be used so that the computer of the second ground station ST2 transmits the second gain factor to the transmitter of the first ground station ST1.

In this latter case, the variation of power in transmission is taken into account in the measurement in reception to establish a coverage mapping representative of the functioning of the transmitting antenna ANT1_SOL.

Usage of the Sequence of Data Bits

According to an embodiment, the sequence of data bits $SEQ_{BIT}$ may be used to encode power information items of the transmitting antenna ANT1_SOL for each new tested orientation of the antenna. Moreover, the orientation itself may be encoded in the sequence of data bits $SEQ_{BIT}$. The process of an embodiment of the invention thus makes it possible to carry out a power test for a given orientation of the transmitting antenna ANT1_SOL while communicating to the receiver of the second ground station ST2 information items which can be exploited to improve the detection of the signals and to record the measurements directly.

According to an embodiment which can be combined with the preceding embodiment, the sequence of data bits $SEQ_{BIT}$ may be repeated a certain number of times in the test signal $S_{test}$. In this case, the PN sequence modulates several sequences of data bits $SEQ_{BIT}$. The size of the PN sequence may be adapted or it may also be repeated. When the size of the sequence of data bits $SEQ_{BIT}$ modulated by the PN sequence is longer, then the scanning speed of the transmitting antenna ANT1_SOL may be adapted to correspond to a longer duration of detection of the test signal $S_{test}$.

The process thus makes it possible to adapt the length of the sequence of data bits $SEQ_{BIT}$ to make it possible to improve the processing gain at the level of the receiver and thus the antenna gain.

As a result, if a single sequence of data bits $SEQ_{BIT}$ modulated by a PN sequence is not sufficient for the detection, a retransmission of the test signal $S_{test}$ with an encoding of a plurality of $SEQ_{BIT}$ sequences may be implemented. The process of an embodiment of the invention makes it possible to repeat the sequence of data bits $SEQ_{BIT}$ in the test signal $S_{test}$ in order to raise the detection threshold. In fact, the fact of increasing the duration of the test signal $S_{test}$ while repeating the sequence of data bits $SEQ_{BIT}$ makes it possible to increase the integration time of each data bit and thus increase the power density per data bit received.

When the scanning speed of the transmitting antenna ANT1_SOL is reduced then the measurement time in reception for analysing the repeated sequence of data bits increases. Since the processing gain is improved, the receiver has a wider detection range.

The process of an embodiment of the invention makes it possible to use one or two polarisation components in reception to:
  generate an instruction for controlling the scanning speed of the transmitting antenna ANT1_SOL and/or;
  repeat a certain number of times the sequence of data bits $SEQ_{BIT}$ in the test signal $S_{test}$ to obtain a given antenna gain in reception and/or;
  repeat a certain number of times the PN sequence with or without encoding of a $SEQ_{BIT}$ sequence in order to improve detection.

A physical computer of the transmitter of the first ground station makes it possible according to an embodiment to encode configuration information items of each test in the sequence of data bits such as:
  the orientation of the antenna and/or
  the current scanning speed and/or;
  the transmission power of the test signal $S_{test}$.

According to another embodiment, if the PN sequence is short, the process of an embodiment of the invention makes it possible to repeat the PN sequence a certain number of times in the test signal $S_{test}$ in order to increase the processing gain in reception and thus improve the detection of the test signal $S_{test}$. The repetition of the PN sequence may be carried out without sequence of data bits $SEQ_{BIT}$ since the objective is to detect in reception the presence of the test signal $S_{test}$ in order to adapt the gain in reception or to enslave the transmitter by a power or scanning speed instruction.

In the case where two antennas in reception are configured according to orthogonal polarisations, the detection of the copolarised component makes it possible to demodulate the PN sequence and to supply to the second antenna an information item making it possible to carry out a coherent demodulation. The coherent demodulation is performed by sharing the PN sequence received by the first antenna ANT2_SOL(2) and demodulated by the receiver with the receiver of the second antenna ANT2_SOL(2) detecting the crossed polarisation component. The correlation of the expected data with the demodulated PN sequence of the copolarised component makes it possible to increase the detection levels of the crossed polarisation component.

Transmitter Control

In all the embodiments, the demodulation and the decoding of data of the sequence of data bits $SEQ_{BIT}$ makes it possible to deduce an instruction for controlling the transmitter. This instruction may be transmitted automatically from a computer and a component for accessing a communication network by terrestrial or satellite route.

Thus the scanning speed is modified thanks to a command for controlling the motor. The resolution, that is to say the orientation pitch of the antenna, may also be controlled to obtain different measurements in a given cone of orientation of the antenna ANT1_SOL.

According to an embodiment, the scanning speed of the transmitting antenna ANT1_SOL may include a first preconfiguration. That is to say that in the assumed coverage limit, the scanning speed of the antenna is reduced making it possible to repeat several sequences of data bits $SEQ_{BIT}$ so as to increase the gain in reception and reduce the signal detection thresholds. On the other hand, when the antenna is directed according to an orientation pointing for example at the satellite, the scanning speed of the antenna may be faster because the test signals $S_{test}$ may include shorter sequences of data bits $SEQ_{BIT}$ and PN sequences.

Satellite Configuration

The process of an embodiment of the invention may be applied with two types of configurations of repeaters of the satellite SAT.

A first mode of configuration of the repeaters used by the process of an embodiment of the invention is the FGM mode which makes it possible to define a fixed power in each repeater.

The repeater applies a same gain for each test signal $S_{test}$ to retransmit to the station on the ground ST2. In this case, the receiver on the ground measures power variations in keeping with variations due to changes of orientation of the transmitting antenna ANT1_SOL during tests.

A second mode of configuration of the repeaters of the satellite by the process of an embodiment of the invention is the ALC mode. The ALC mode makes it possible to adjust the gain to apply to the signal received by the satellite as a function of the level of the signal received at the input of the satellite so as to deliver at the output of the repeater a fixed signal level.

The amplification of the signals within the satellite is controlled dynamically. The range of gain values to apply to the signals at the input of the satellite makes it possible to amplify the latter when their power is comprised in a given range. The differences in power received at the level of the receiving antenna of the satellite are then compensated to maintain a fixed power level at the output of the amplification chain.

Thus it is possible to measure the variations in gain applied at the level of the amplification chain of the satellite to deduce therefrom the pattern of the antenna in transmission, the test being able to be carried out for a series of orientations of the antenna.

The measurements of gains applied to the input signals of the satellite are carried out dynamically by the satellite. These measurements may be saved and/or sent to a station on the ground for example thanks to the telemetry antenna of the satellite.

In order to improve the detection of the signal at the input of the satellite when the signal is noisy or when its level is low, the encoding of a sequence of bits according to the process of an embodiment of the invention makes it possible to achieve better detection in the satellite. The measurements are retransmitted for example on the ground via the telemetry antenna. The sequence of bits may be repeated or the scanning speed of the transmitting antenna on the ground may be slowed down so as to increase the reception gain on board the satellite.

By considering that no interference on the uplink and on the downlink is present and if the satellite is configured in an ALC mode, the repeater will amplify the signal received in a nominal gain range. In reception, the level received may be forecast by knowing the amplification characteristics of the repeater of the satellite and by knowing the power level of the transmitting antenna ANT1_SOL.

Thus the two modes of configuration of the satellite of an embodiment of the invention are compatible and may be used jointly. For example, over a certain range of power level values, the ALC mode is configured and below a certain power threshold at the input of the satellite, a fixed gain is applied to the signals received.

Figure 3:
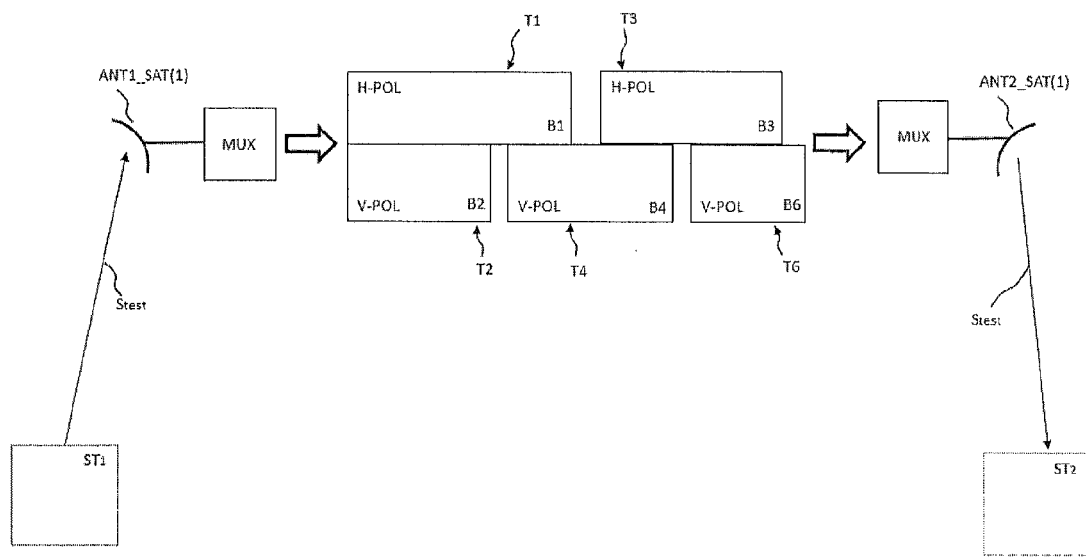
FIG. 3: an example of architecture of different series of transponders of the satellite having linear polarisations.

According to an embodiment, the satellite SAT includes transponders configured according to two orthogonal linear polarisations. FIG. 3 represents an embodiment example, a first series of transponders T1, T3 includes a horizontal linear polarisation H-POL and a second series of transponders T2, T4, T6 includes a vertical polarisation V-POL. Each transponder T1, T2, T3, T4, T6 includes a frequency band B1, B2, B3, B4, B6.

A multiplexer at the input and at the output of the satellite SAT may be used to allocate the different signals in the different transponders as a function of the frequencies in reception and in transmission and the frequency bands of each transponder.

The co-polarised components and the crossed components of the test signal $S_{test}$ are transmitted and processed by the transponders having polarisations appropriate to the components. The signals are then transmitted by each transponder of the satellite SAT at the output to the second station on the ground ST2.

Management of Induced Interferences

In reception, the test signal received $S_{test}$ is multiplied by a saved and known PN sequence of the receiver of the second ground station ST2. The correlation of the data received and known data enables the sequence of data bits $SEQ_{BIT}$ to be deduced in baseband.

Sequences of PN type make it possible, thanks to their very good autocorrelation properties, to detect a signal even in a significant noise level.

When third party signals are detected causing interferences in the total signal received, the latter are eliminated thanks to the demodulation of the PN sequence. As a result, the process of an embodiment of the invention makes it possible to test a mapping of a transmitting antenna while reducing the power thereof at transmission and while becoming free of interferences caused by the reception of third party signals. The processing gain in reception is improved thanks to the configuration of the PN sequence(s) and $SEQ_{BIT}$ sequence(s) by the modulator in transmission.

The correlation of the known PN sequence with a demodulated sequence generates a power peak when the two sequences correspond. The precision of detection is realised to the nearest symbol since the multiplication of two identical PN sequences makes it possible to obtain a perfect correspondence and a power peak during detection. The multiplication of two PN sequences offset by a symbol gives a power drowned in the noise level.

Following the demodulation of the PN sequence, the energy of the useful signal becomes important vis-à-vis noise and the level of the interference signals.

When interferences are received at the input of the satellite SAT and when interference signals are amplified by the satellite SAT, demodulation in reception by the receiver of the second ground station ST2 makes it possible to deduce the useful signal thanks to the spread spectrum modulation.

On the other hand, in this latter case, the satellite has amplified a signal corresponding to the sum of the test signal $S_{test}$ and interferences noted J. If the repeater is configured in an ALC mode, the output power of the satellite will be biased by the presence of interferences which have been amplified. Thus the level of amplification of the repeater cannot be taken into account as such to deduce a relevant data of coverage of the transmitting antenna on the ground ANT1_SOL.

The process of an embodiment of the invention makes it possible to deduce the value of the power received linked to the interferences J in reception on the ground to generate an interference compensation factor $F_J$. This factor $F_J$ makes it possible to correct the gain of the satellite biased by the presence of interferences in the saved received power measurement.

A first method includes the power measurement of the signal $S_{test}+J$ before the demodulation of the test signal $S_{test}$. For example, this measurement is carried out from a spectrum analyser. According to another method, this measurement is carried out by the use of the discrete Fourier transform and by the application of Parseval's theorem on the digitized levels.

A second method includes the reception of the test signal $S_{test}$ with the interferences J in two different and identical routes. The signals are demodulated in the two routes. One of the routes includes a band rejection filter of the base band of the demodulated test signal $S_{test}$ corresponding to the demodulated base data.

The comparison of the two demodulated signals in each route makes it possible to obtain the power of the interferences J isolated by subtracting the two signals from the two routes.

When the power linked to the presence of interferences J is calculated, the interference compensation factor $F_J$ may be taken into account to deduce the measurements of received powers and the gains needed to be configured for the transmitting antenna for a given orientation.

The interference compensation factor $F_J$ may be calculated for each measurement corresponding to a given orientation of the transmitting antenna ANT1_SOL. This factor may be memorised in a memory of the second ground station ST2. It may also be transmitted to the first ground station ST1.

According to another embodiment, the transmitting antenna ANT1_SOL of the first ground station ST1 each calibrate transmission powers of the antenna ANT1_SOL as a function of the latest interference power measurements while taking into account the interference compensation factor. This solution makes it possible to adjust dynamically the power level necessary in transmission.

An example of calculation of the power of interferences is given below.

If $S_0$ designates the power of the useful signal received and $J_0$ the power of the interferences received at $t_0$. $EIRP_0$ is the total power received by the receiving antenna of the second ground station ST2. This gives:

$S_0 + J_0 = EIRP_0;$ $S_0$ and $J_0$ may be estimated as described previously.

One notes the ratio $k_0 = S_0/J_0$.

This ratio may be chosen in a mode as the interference compensation factor or it may also make it possible to define it according to the definition given to the interference compensation factor.

One obtains $S_0 = EIRP_0 * (k_0/(k_0+1))$

At the following instant $t_1$, corresponding to a new orientation of the transmitting antenna ANT1_SOL, a computer of the ground station ST1 makes it possible to calculate the factor $k_1$ deduced from the measurements at $t_0$.

The variation of the output level of the signal at the transmitting antenna will be calculated as a function of the apparent received power EIRP of the antenna of the second ground station ST2.

The variations of the test signal received $S_{test}$ in reception may be calculated between two transmissions of the transmitting antenna for two different orientations of the antenna ANT1_SOL.

In the same way the useful power of the test signal $S_{test}$ at the input of the receiver of the satellite is calculated to take into account the variable gain of the satellite in a configuration of ALC type.

Details of Operational Configurations

Carrier Frequency and Band Width

According to an embodiment, the carrier frequency may be chosen, for example, in a Ku band or any other frequency band. A carrier frequency assuring the uplink to the satellite may for example be chosen equal to 13.78267 GHz with a band of 54 MHz. A carrier frequency assuring the downlink may be chosen equal to 10.98267 GHz.

The band width of the channel used depends on the spread spectrum function and thus the size of the PN sequence.

According to another example, the uplink channel may have a width of 54 MHz. According to another example, the channel may be even narrower, for example of the order of 5 MHz on a channel of 72 MHz.

Encoding, Processing Gain

According to a first example, a sequence of data bits transmitted at 1 k bits/s (1000 bits/s) may be encoded with a PN sequence of 25 M symbols/s (25000000 symbols/s). In this case each data bit is encoded by 25000 symbols of the PN sequence. The processing gain is $10 \cdot \log_{10}(D_{SYM}/D_{BIT})$, that is to say 44 dB in this example.

According to a second example, a sequence of data bits transmitted at 1 k bits/s (1000 bits/s) may be encoded with a PN sequence of 1 M symbols/s (1000000 symbols/s). In this case, each data bit is encoded by 1000 symbols of the PN sequence.

According to a third example, the sequence of data bits $SEQ_{BIT}$ is transmitted at a rate of 15 kbit/s. The sequence of data bits $SEQ_{BIT}$ is modulated by a pseudo-random PN sequence of 3.84 Msymbols/s. Each data bit is thus encoded by 156 symbols. A processing gain GT of 24 dB is obtained.

According to another embodiment example, a PN sequence of a rate of 50 Msymbols/s makes it possible to encode a sequence of bits of 100 bits/s with a processing gain $G_T$ of 57 dB.

These examples make it possible to understand that the processing gain may be determined beneficially in a significant manner by considering a favourable ratio between the size of a PN sequence and the size of the sequence of data bits $SEQ_{BIT}$.

The sequence of data bits has no other aim than to establish a test and to transmit certain useful information items of configuration of the transmission according to the envisaged mode of the process of the invention.

In the most complete embodiment of the invention, the transmission power, the antenna orientation and the scanning speed are transmitted in the sequence of data bits $SEQ_{BIT}$. In this instance, a limited number of data bits is necessary to transmit these information items. As a result, the sequence of data bits $SEQ_{BIT}$ may be chosen relatively short, that is to say include for example several bits, a hundred bits or even a thousand bits. Other examples may be chosen to define the length of the sequence of data bits.

Having described and illustrated the principles of the invention with reference to various embodiments, it will be recognized that the various embodiments can be modified in arrangement and detail without departing from such principles. It should be understood that the devices, modules, processors, processing units, programs, processes, or methods described herein are not related or limited to any particular type of computing environment, unless indicated otherwise. Various types of specialized computing environments may be used with or perform operations in accordance with the teachings described herein. Elements of embodiments shown in software may be implemented in hardware and vice versa.

Computer programs comprising machine executable instructions for implementing at least one of the steps of the method described herein or function(s) of various elements of the structural arrangement can be implemented by one or more computers comprising at least an interface, a physical processor and a non-transitory memory (also broadly referred to as a non-transitory machine readable or storage medium). The computer is a special purpose computer as it is programmed to perform specific steps of the method(s) described above. The non-transitory memory is encoded or programmed with specific code instructions for carrying out or causing to carry out the above method(s) and its/their associated steps. The non-transitory memory may be arranged in communication with the physical processor so that the physical processor, in use, reads and executes the specific code instructions embedded in the non-transitory memory. The interface of the special purpose computer may be arranged in communication with the physical processor and receives input parameters that are processed by the physical processor.

Execution of the sequences of machine instructions contained in the memory causes the processor or processing unit to perform at least some of the process steps, calculations or function(s) of the procedures described herein. One or more physical processors or physical processing units in a multi-processing arrangement may also be employed to execute the sequences of instructions contained in the memory or machine/computer readable medium. In alternative embodiments, hard-wired circuitry may be used in place of or in combination with software instructions.

The term "computer readable medium" or "machine readable medium" as used herein refers to any medium that participates in providing instructions to a processor or processing unit for execution. Such a medium is non-transitory and may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer/machine readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer/machine readable media may be involved in carrying one or more sequences of one or more instructions to processor for execution.

It will be appreciated by one skilled in the art that the disclosed arrangements and methods described herein represent a solution to the technological problem currently faced by designers for testing the radiation pattern of an antenna.

The invention claimed is:

1. A process for measuring antenna gains of a transmitter of a first terrestrial station for generating at least one mapping of a coverage of said antenna, the process comprising:
performing a plurality of transmissions of a test signal, by the transmitter of the first terrestrial station, sent to a satellite, the satellite including a repeater to retransmit the test signal to a second terrestrial station, the transmissions by the transmitter of the first station being carried out according to different orientations of the antenna of the transmitter, said test signal being spread spectrum modulated in a channel of predetermined width by a pseudo-random numerical sequence (PN) encoding at least one sequence of data bits generated by a computer of the transmitter;
receiving each test signal by a receiver of the second terrestrial station;
demodulating each test signal making it possible to measure a received power of each test signal;
comparing each power with a first predefined reference power threshold, and
generating an encoding instruction aiming to encode a given number of sequences of data bits by at least one pseudo-random sequence in a same test signal when said received power of a test signal is below the first power threshold.

2. The process for measuring according to claim 1, wherein the test signal generated includes a plurality of PN sequences, the number of PN sequences being dependent on the transmission power level of the test signal and the orientation of the antenna.

3. The process according to claim 2, wherein the sequence of data bits is a sequence including only bits of value equal to 1 such that the sequence received corresponds to the PN sequence.

4. The process for measuring according to claim 1, wherein at least one sequence of data bits includes data encoding the current orientation of the transmitting antenna of the transmitter of the first terrestrial station, said process including a decoding of the sequence of data bits by a computer of the receiver of the second terrestrial station to assign the decoded current angular orientation of the antenna of the transmitter to the power of the test signal measured in reception.

5. The process for measuring according to claim 1, wherein at least one sequence of data bits includes data corresponding to the transmission power of the antenna of the transmitter of the first terrestrial station.

6. The process for measuring according to claim 1, wherein at least one sequence of data bits includes data corresponding to a scanning speed of the antenna of the transmitter of the first terrestrial station.

7. The process for measuring according to claim 1, wherein at least one sequence of data bits includes data corresponding to a calibration of the test signal transmitted by the antenna of the transmitter of the first terrestrial station.

8. The process for measuring according to claim 1, further comprising generating a motor enslavement instruction to control a scanning speed of the antenna of the transmitter of the first terrestrial station as a function of the measured power level of the test signal received.

9. The process for measuring according to claim 1, further comprising generating a motor enslavement instruction to control a scanning speed of the antenna of the transmitter of the first terrestrial station as a function of the orientation of the antenna corresponding to the measurement of the measured power of the test signal received.

10. The process for measuring according to claim 1, wherein the test signal includes a co-polarised wave component, corresponding to the transmission polarisation of the signal and a cross-polarised wave component, corresponding to a polarisation orthogonal to a transmission polarisation, the repeater of the satellite amplifying said two polarisations, the receiver of the second station on the ground demodulating the two orthogonal components of the test signal, the measurement of the power of the test signal including a measurement of the power of the transmission polarisation component, said process further comprising comparing said power of the transmission polarisation component with a second reference power threshold so as to generate automatically an encoding instruction when the power value is less than the second reference power threshold.

11. The process for measuring according to claim 10, wherein the measurement of the power of the test signal includes a power measurement of the cross-polarised wave component of the test signal received by the receiver of the second terrestrial station and wherein a comparison of the received power level of said cross-polarised component with a third reference power threshold makes it possible to generate a synchronisation instruction, said synchronisation instruction making it possible to retrieve a frequency reference data and/or a temporal reference data calculated from the demodulation of the transmission polarisation component.

12. The process for measuring according to claim 11, wherein the generation of a synchronisation instruction leads to the generation of an encoding instruction.

13. The process for measuring according to claim 1, wherein at least one encoding instruction and/or at least one motor enslavement instruction is automatically transmitted to a computer of the transmitter of the first, terrestrial station by means of a return channel.

14. The process for measuring according to claim 13, wherein the return channel is established:
either via a terrestrial network;
or via a wireless channel passing through the satellite and transmitted to a receiver of the first terrestrial station.

15. The process for measuring according to claim 1, wherein a scanning speed of the antenna of the transmitter of the first terrestrial station is coordinated with the number of sequences of data bits encoded by at least one pseudo-random sequence (PN) such that the scanning of the antenna includes sufficiently long durations of maintaining the antenna at a given orientation so that a test signal including a plurality of sequences of data bits can be transmitted.

16. The process for measuring according to claim 1, wherein the number of sequences of data bits is determined to obtain a desired processing gain in reception of the antenna of the receiver of the second terrestrial station.

17. The process for measuring according to claim 1, wherein a measurement of the interferences amplified by the repeater of the satellite is carried out in reception by the receiving antenna in order to deduce a compensation factor of the interferences for each power measurement received.

18. A process for generating a series of measurements to establish a mapping of a transmission pattern of an antenna of a transmitter a terrestrial station, the process comprising performing a series of measurements of powers of test signals received by a receiver of a second terrestrial station carried out by the process of claim 1, said power measurements each being associated with an orientation of the antenna of the transmitter of the first terrestrial station and being memorised in a memory of the second terrestrial station.

19. A system including:
- a first station on the ground comprising a generator of signals making it possible to encode a first sequence of data bits on a test signal to transmit from a first antenna;
- a satellite comprising at least one receiving antenna to receive the test signal, at least one transponder to retransmit the amplified test signal to a second terrestrial station, and
- a second terrestrial station comprising at least one receiving antenna and a physical computer configured to calculate and process the signal to demodulate the test signal received by the satellite and automatically generate an encoding instruction according to the process of claim 1.

\* \* \* \* \*